US012660462B2

(12) United States Patent
Park

(10) Patent No.: US 12,660,462 B2
(45) Date of Patent: Jun. 16, 2026

(54) DISPLAY DEVICE WITH LIQUID REPELLENT COVER LAYER OVERLAPPING A METAL LAYER AND MANUFACTURING METHOD THEREOF

(71) Applicant: Samsung Display Co., Ltd., Yongin-si (KR)

(72) Inventor: Jongjang Park, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 617 days.

(21) Appl. No.: 17/885,536

(22) Filed: Aug. 11, 2022

(65) Prior Publication Data

US 2023/0125315 A1     Apr. 27, 2023

(30) Foreign Application Priority Data

Oct. 26, 2021     (KR) ......................... 10-2021-0143599

(51) Int. Cl.
    *H10K 59/38*       (2023.01)
    *H10K 50/86*       (2023.01)
             (Continued)

(52) U.S. Cl.
    CPC ........... *H10K 59/38* (2023.02); *H10K 50/865* (2023.02); *H10K 71/00* (2023.02); *H10K 59/1201* (2023.02); *H10K 59/122* (2023.02)

(58) Field of Classification Search
    CPC ...... H10K 59/38; H10K 50/865; H10K 71/00; H10K 59/1201; H10K 59/122;
             (Continued)

(56) References Cited

U.S. PATENT DOCUMENTS 8,947,619 B2   2/2015  Li et al.
11,041,981 B2   6/2021  Jung et al.
        (Continued)

FOREIGN PATENT DOCUMENTS

KR      20090006021 A   *  1/2009  ............. G03F 7/033
KR    10-2019-0008493      1/2019
         (Continued)

OTHER PUBLICATIONS

English translation of KR20200086413-A (Year: 2020).*
English translation of KR20090006021 (Year: 2009).*

*Primary Examiner* — William B Partridge
*Assistant Examiner* — David Paul Sedorook
(74) *Attorney, Agent, or Firm* — CANTOR COLBURN LLP

(57)        ABSTRACT

A display device including: a display unit including a plurality of pixels; and a color converter overlapping the display unit. The color converter includes a first color converter, a second color converter, a transmitter, and a light blocking member. The first color converter includes a first color converting layer including first semiconductor nanocrystals, and a first color filter overlapping the first color converting layer. The second color converter includes a second color converting layer including second semiconductor nanocrystal, and a second color filter overlapping the second color converting layer, the transmitter includes a transmitting layer. The light blocking member includes a light blocking member disposed among the adjacent first color converting layer, the second color converting layer, and the transmitting layer, a metal layer disposed on the light blocking member, and a liquid repellent cover layer overlapping the metal layer.

8 Claims, 13 Drawing Sheets

(51) Int. Cl.
    *H10K 59/12*         (2023.01)
    *H10K 59/122*       (2023.01)
    *H10K 71/00*        (2023.01)

(58) Field of Classification Search
    CPC ............. H10K 59/12; H10K 2102/331; H10K
                 50/8426; H10K 59/126; H01L 27/322;
                 H01L 51/5284; H01L 51/56; H01L
                 27/3246; H01L 2227/323
    See application file for complete search history.

(56) References Cited

U.S. PATENT DOCUMENTS

| | | |
|---|---|---|
| 11,221,520 B2 | 1/2022 | Kim et al. |
| 2005/0008768 A1 | 1/2005 | Onishi et al. |

| | | | |
|---|---|---|---|
| 2005/0083453 A1* | 4/2005 | Nakano | ............. G02F 1/133555 |
| | | | 349/114 |
| 2012/0098414 A1* | 4/2012 | Nakamura | ........... H10K 59/122 |
| | | | 445/24 |
| 2018/0211979 A1* | 7/2018 | Lee | ....................... H10K 50/115 |
| 2018/0287027 A1* | 10/2018 | Chaji | .................... H01L 25/167 |
| 2019/0137815 A1 | 5/2019 | Kim et al. | |
| 2019/0296088 A1* | 9/2019 | Kim | ..................... H10K 59/877 |
| 2020/0287159 A1* | 9/2020 | Lee | .................... H10K 59/8722 |
| 2021/0249478 A1 | 8/2021 | Oh et al. | |

FOREIGN PATENT DOCUMENTS

| | | | | |
|---|---|---|---|---|
| KR | 10-2020-0086413 | | 7/2020 | |
| KR | 20200086413 A | * | 7/2020 | .............. G02B 5/20 |
| KR | 1020200135130 A | | 12/2020 | |
| KR | 10-2021-0035794 | | 4/2021 | |
| KR | 1020210101380 A | | 8/2021 | |

* cited by examiner

FIG. 4

DISPLAY DEVICE WITH LIQUID REPELLENT COVER LAYER OVERLAPPING A METAL LAYER AND MANUFACTURING METHOD THEREOF

CROSS-REFERENCE TO RELATED APPLICATION

This application claims priority from and the benefit of Korean Patent Application No. 10-2021-0143599 filed on Oct. 26, 2021, which is hereby incorporated by reference for all purposes as if fully set forth herein.

BACKGROUND

Field

Embodiments of the invention relate generally to a display device and, more specifically, to a display device manufacturing method.

Discussion of the Background

To implement a display device having a reduced optical loss caused by a color filter and having high color reproducibility, a display device including a color conversion panel using semiconductor nanocrystals, such as quantum dots, has been proposed.

The above information disclosed in this Background section is only for understanding of the background of the inventive concepts, and, therefore, it may contain information that does not constitute prior art.

SUMMARY

Embodiments of the present invention provide a display device with improved light outputting efficiency, and a method for manufacturing a display device.

Additional features of the inventive concepts will be set forth in the description which follows, and in part will be apparent from the description, or may be learned by practice of the inventive concepts.

An embodiment of the present invention provides a display device including: a display unit including a plurality of pixels; and a color converter overlapping the display unit. The color converter includes a first color converter, a second color converter, a transmitter, and a light blocking member. The first color converter includes a first color converting layer including first semiconductor nanocrystals, and a first color filter overlapping the first color converting layer. The second color converter includes a second color converting layer including second semiconductor nanocrystals, and a second color filter overlapping the second color converting layer, the transmitter includes a transmitting layer. The light blocking member includes a light blocking member disposed among the adjacent first color converting layer, the second color converting layer, and the transmitting layer, a metal layer disposed on the light blocking member, and a liquid repellent cover layer overlapping the metal layer.

The metal layer may cover a lateral side and one side of the light blocking member.

The metal layer may include at least one of aluminum (Al) and silver (Ag).

The liquid repellent cover layer may overlap one side of the light blocking member.

The liquid repellent cover layer may overlap the lateral side of the light blocking member.

The transmitter may further include a third color filter overlapping the transmitting layer, and at least two of the first color filter, the second color filter, and the third color filter may overlap each other on the light blocking member.

The metal layer and the liquid repellent cover layer may overlap at least two of the first color filter, the second color filter, and the third color filter overlapping the light blocking member.

The display unit may include: a first substrate; a transistor disposed on the first substrate; a first electrode electrically connected to the transistor; a pixel defining layer overlapping at least some of the first electrode; an emission layer disposed on the first electrode; and a second electrode disposed on the emission layer.

The pixel defining layer may overlap the light blocking member.

Another embodiment of the present invention provides a method for manufacturing a display device, including: providing a display unit including a plurality of pixels; and providing a color converter on the display unit. The providing of a color converter includes forming a light blocking member including a first opening, depositing a metal thin film on the light blocking member, forming a metal layer including a second opening overlapping the first opening on the metal thin film by using an inkjet etching method, forming a liquid repellent cover layer on the metal layer, and forming a first color converting layer including first semiconductor nanocrystals and a second color converting layer including second semiconductor nanocrystals in the first opening and the second opening.

The forming of a liquid repellent cover layer may include applying a liquid repellent material layer on the metal layer and curing the same, and forming a third opening overlapping the first opening and the second opening by patterning the liquid repellent material layer.

The forming of a first color converting layer and a second color converting layer may use an inkjet process.

The metal layer may cover a lateral side and one side of the light blocking member.

The metal layer may include at least one of aluminum (Al) and silver (Ag).

The liquid repellent cover layer may overlap one side of the light blocking member.

The liquid repellent cover layer may overlap the lateral side of the light blocking member.

The color converter may include a first color converter, a second color converter, a transmitter, and a light blocking member. The first color converter includes the first color converting layer including the first semiconductor nanocrystals, and a first color filter overlapping the first color converting layer. The second color converter includes the second color converting layer including the second semiconductor nanocrystals, and a second color filter overlapping the second color converting layer. The transmitter further includes a transmitting layer, and a third color filter overlapping the transmitting layer, and at least two of the first color filter, the second color filter, and the third color filter overlap each other on the light blocking member.

The metal layer and the liquid repellent cover layer may overlap at least two of the first color filter, the second color filter, and the third color filter overlapping the light blocking member.

The display unit may include: a first substrate; a transistor disposed on the first substrate; a first electrode electrically connected to the transistor; a pixel defining layer overlapping at least some of the first electrode; an emission layer disposed on the first electrode; and a second electrode disposed on the emission layer.

The pixel defining layer may overlap the light blocking member.

According to the embodiments, a display device with improved light outputting efficiency and the method for manufacturing a display device may be provided.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 4 shows a cross-sectional view of a display panel according to an embodiment.

DETAILED DESCRIPTION

Figure 1:
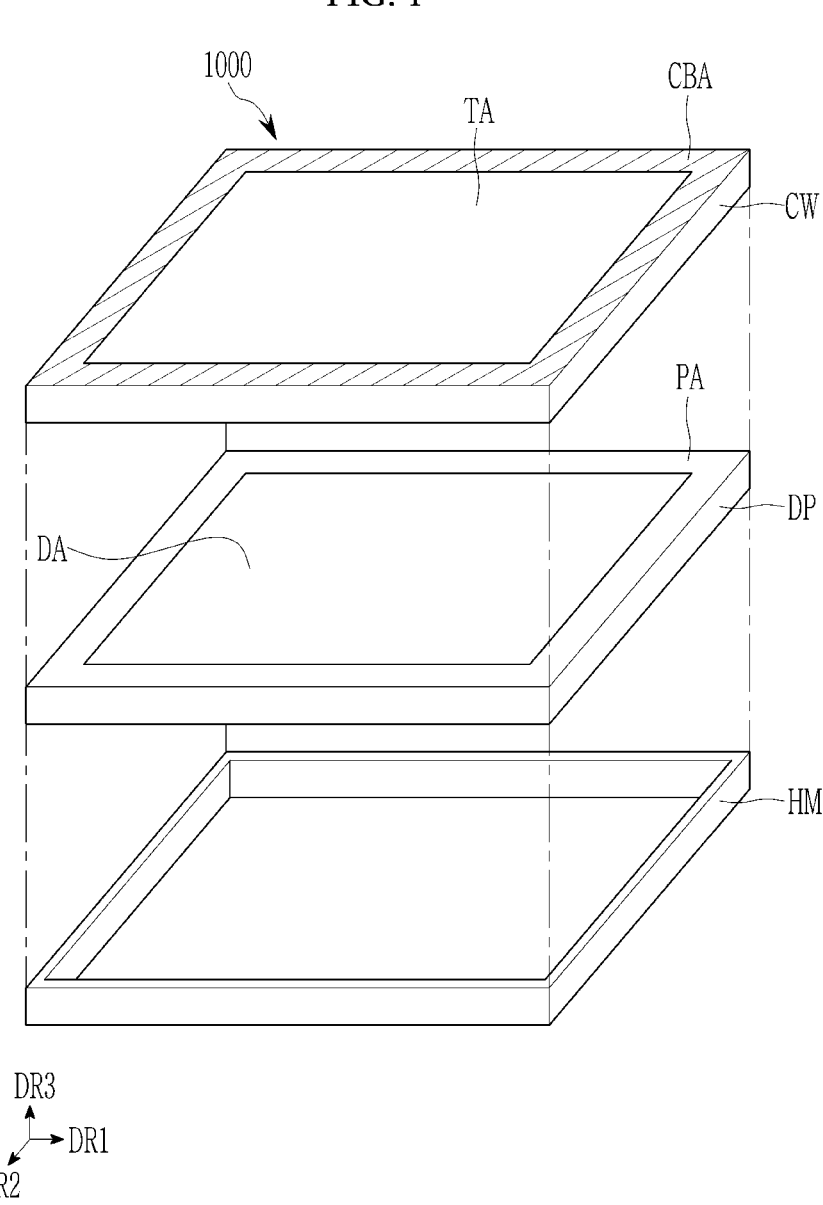
FIG. 1 shows an exploded perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The phrase "in a plan view" means viewing an object portion from the top, and the phrase "in a cross-sectional view" means viewing a cross-section of which the object portion is vertically cut from the side.

A display device according to an embodiment will now be described with reference to FIG. 1. FIG. 1 shows an exploded perspective view of a display device according to an embodiment.

Referring to FIG. 1, the display device may include a cover window (CW), a display panel (DP), and a housing (HM).

The cover window (CW) may include an insulating panel. For example, the cover window (CW) may be made of glass, plastic, or a combination thereof.

A front side of the cover window (CW) may define a front side of the display device 1000. The transmission area (TA) may be an optically transparent region. For example, the transmission area (TA) may have visible ray transmittance of equal to or greater than about 90%.

A blocking area (CBA) may define a shape of the transmission area (TA). The blocking area (CBA) may be near the transmission area (TA) and may surround the transmission area (TA). The blocking area (CBA) may have light transmittance that is lower than light transmittance of the transmission area (TA). The blocking area (CBA) may include an opaque material for blocking light. The blocking area (CBA) may have a predetermined color. The blocking area (CBA) may be defined by a bezel layer provided in addition to a transparent substrate for defining the transmission area (TA) or may be defined by an ink layer inserted into, or colored to, the transparent substrate.

One side of the display panel (DP) on which images are displayed is parallel to a side defined by a first direction (DR1) and a second direction (DR2). A normal direction of the one side on which the image is displayed, that is, a thickness direction of the display panel (DP), is indicated by a third direction (DR3). Front sides (or upper sides) and rear sides (or lower sides) of respective members are distinguished by the third direction (DR3). However, the direction indicated by the first to third directions DR1, DR2, and DR3 are relative concepts, and may be converted into other directions.

The display panel (DP) may be a flat rigid display panel, but it is not limited thereto, and it may be a flexible display panel. The display panel (DP) may be made of an organic light emitting panel. However, a type of the display panel (DP) is not limited thereto, and the display panel (DP) may be made of various types of panels. For example, the display panel (DP) may be made of a liquid crystal panel, an electrophoretic display panel, and an electro-wetting display panel. The display panel (DP) may be made of next-generation display panels, such as a micro light emitting diode (LED) display panel, a quantum dot light emitting diode (LED) display panel, or a quantum dot organic light emitting diode display panel.

The micro LED display panel is made for the light emitting diodes (LED) with a size of 10 to 100 micrometers to configure respective pixels. The micro LED display panel may use an inorganic material, may omit a backlight, may have a fast reaction rate, may realize high luminance with lower power, and may not be broken when bent, which are merits. The quantum dot LED display panel may be made by attaching a quantum dot included film, or forming with a quantum dot included material. The quantum dot is made of an inorganic material, such as indium or cadmium, and it emits light and represents particles with a diameter of equal to or less than several nanometers. The quantum dot may display light of a desired color by adjusting a particle size of the quantum dot. The quantum dot organic LED display panel is made by using a blue organic light emitting diode as a light source, and attaching a film including red and green quantum dots thereon or depositing a material including red and green quantum dots, thereby realizing the color. The display panel (DP) according to an embodiment may be made of various sorts of display panels in addition to it.

As shown in FIG. 1, the display panel (DP) includes a display area (DA) for displaying images, and a non-display area (PA) provided near the display area (DA). The non-display area (PA) displays no images. The display area (DA) may, for example, have a square shape, and the non-display area (PA) may have a shape surrounding the display area (DA). Without being limited thereto, the shapes of the display area (DA) and the non-display area (PA) may be relatively designed.

The housing (HM) provides a predetermined internal space. The display panel (DP) is installed in the housing (HM). Various kinds of electronic parts, for example, a power supply, a storage device, or a sound input and output module, may be installed in the housing (HM) in addition to the display panel (DP).

Figure 2:
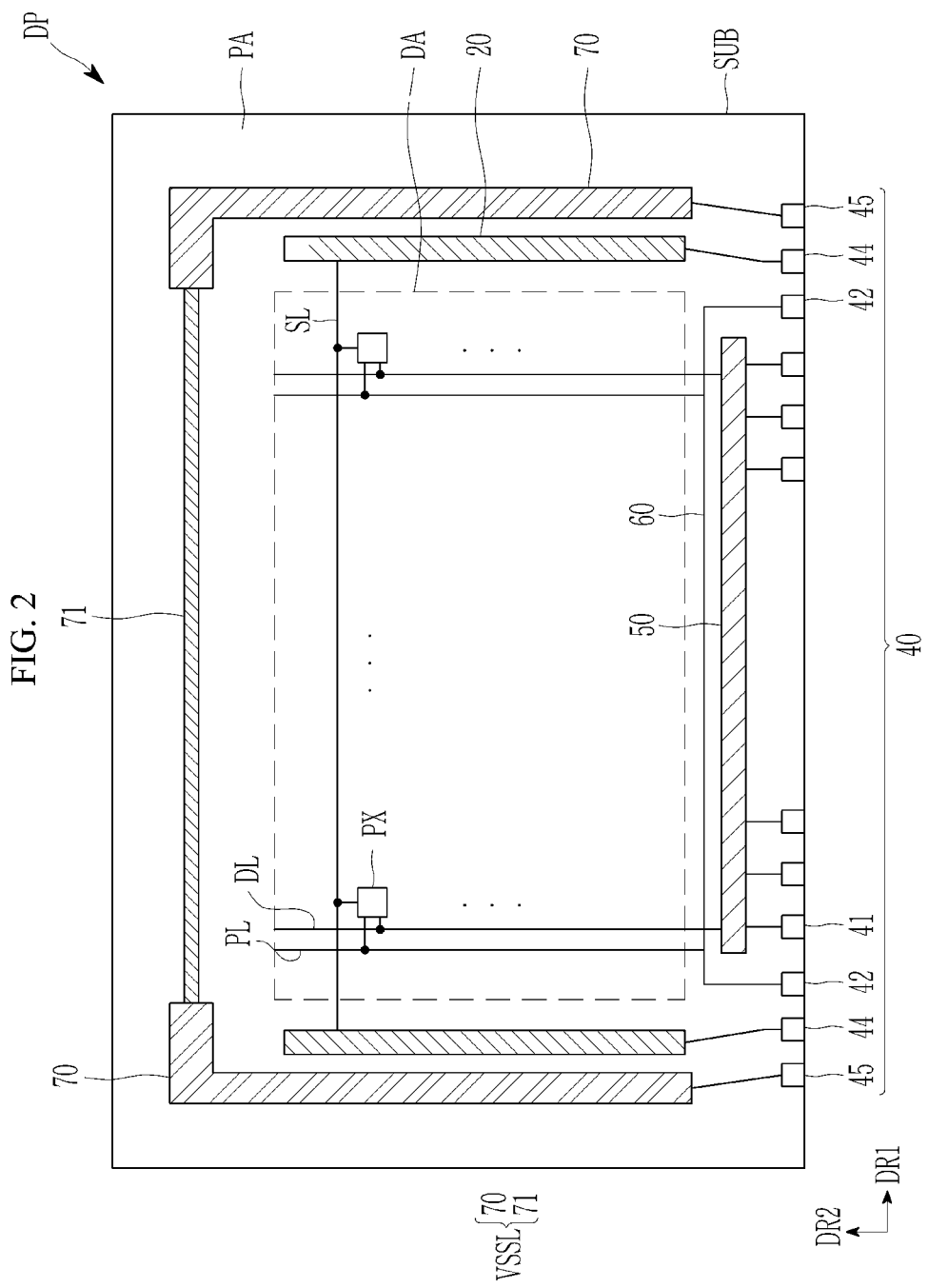
FIG. 2 shows a top plan view of a predetermined region of a display panel according to an embodiment.

A display panel according to an embodiment will now be described with reference to FIG. 2. FIG. 2 shows a top plan view of a predetermined region of a display panel according to an embodiment.

Referring to FIG. 2, the display panel (DP) includes a display area (DA) and a non-display area (PA). The non-display area (PA) may be defined along an edge of the display area (DA).

The display panel (DP) includes a plurality of pixels (PX). The pixels (PX) may be disposed in the display area (DA)

of the substrate (SUB). The pixels (PX) respectively include an organic light emitting diode and a pixel driving circuit connected thereto.

The respective pixels (PX) may, for example, emit red, green, blue, or white light, and they may, for example, include an organic light emitting diode. The display panel (DP) provides a predetermined image through the light emitted by the pixels (PX), and the display area (DA) is defined by the pixels (PX). The non-display area (PA), where the pixels (PX) are not disposed, provides no images.

The display panel (DP) may include a plurality of signal lines and a pad unit. The signal lines may include a scan line (SL) extending in a first direction (DR1), and a data line (DL) and a driving voltage line (PL) extending in the second direction (DR2).

The scan driver 20 is positioned in the non-display area (PA) of the substrate (SUB). The scan driver 20 generates scan signals and transmits them to the respective pixels (PX) through the scan line (SL). Depending on embodiments, the scan driver 20 may be disposed on a left and a right of the display area (DA). The present embodiment is a configuration in which the scan driver 20 is disposed on respective sides of the display area (DA), but the scan driver may be disposed on one side of the display area (DA) according to another embodiment.

The pad unit 40 is disposed on one end of the display panel (DP) and includes a plurality of terminals 41, 42, 44, and 45. The pad unit 40 is not covered by the insulating layer but is exposed, and it may be electrically connected to a flexible printed circuit board (PCB) or a controller (not shown), such as an IC.

The controller changes a plurality of image signals transmitted from an outside into a plurality of image data signals, and transmits the changed signals to the data driver 50 through the terminal 41. The controller may receive a vertical synchronization signal, a horizontal synchronizing signal, and clock signals, may generate control signals for controlling driving of the scan driver 20 and the data driver 50, and may transmit the same to the respective ones through the terminals 44 and 41. The controller transmits a driving voltage (ELVDD) to a driving voltage supply line 60 through the terminal 42. The controller transmits a common voltage to respective common voltage supply lines (VSSL) through the terminal 45.

The data driver 50 is disposed in the non-display area (PA), and it generates data signals and transmits them to the respective pixels (PX) through the data line (DL). The data driver 50 may be disposed on one side of the display panel (DP), and for example, it may be disposed between the pad unit 40 and the display area (DA).

The driving voltage supply line 60 is disposed in the non-display area (PA). For example, the driving voltage supply line 60 may be disposed between the data driver 50 and the display area (DA). The driving voltage supply line 60 provides driving voltages to the pixels (PX). The driving voltage supply line 60 may be disposed in the first direction (DR1) and may be connected to a plurality of driving voltage lines (PL) disposed in the second direction (DR2).

The common voltage supply line (VSSL) is disposed in the non-display area (PA) and provides a common voltage to a common electrode of the organic light emitting diode of the pixel (PX). The common voltage supply line (VSSL) may form a closed loop extending from one lateral side of the substrate (SUB) and surrounding three sides along an edge of the substrate (SUB).

The common voltage supply line (VSSL) may include a main supply line 70 and a sub-supply line 71.

Figure 3:
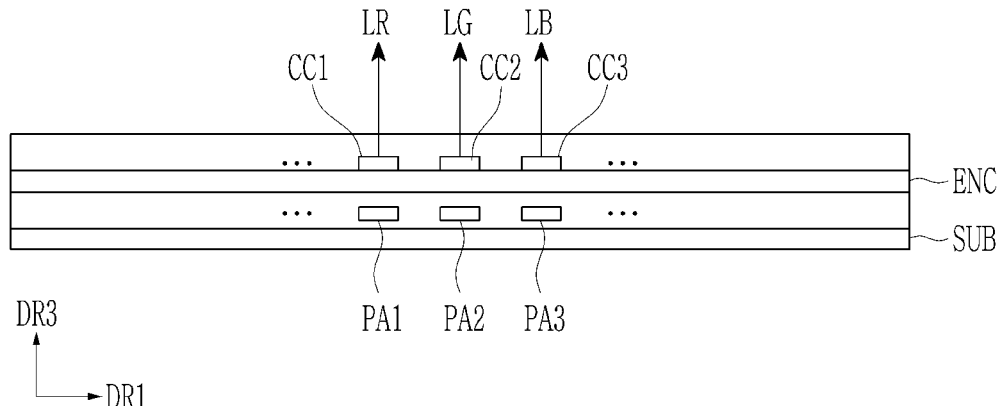
FIG. 3 shows a cross-sectional view of a display panel according to an embodiment.
Figure 4:
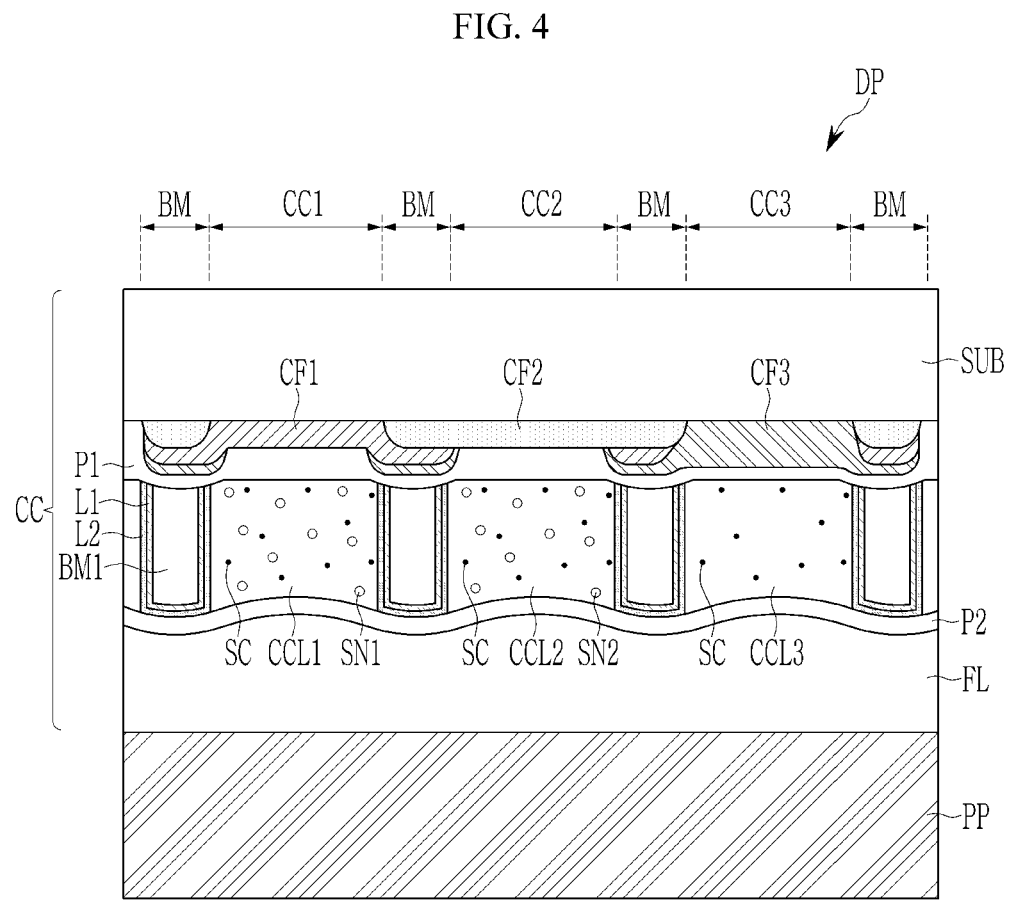

A display area of a display panel according to an embodiment will now be described with reference to FIG. 3 and FIG. 4. FIG. 3 shows a cross-sectional view of a display panel according to an embodiment, and FIG. 4 shows a cross-sectional view of a display panel according to an embodiment.

Referring to FIG. 3, a plurality of pixels (PA1, PA2, and PA3) may be formed on the substrate (SUB) corresponding to the display area (DA). The respective pixels (PA1, PA2, and PA3) may include a plurality of transistors and a light-emitting device connected thereto.

An encapsulation layer (ENC) may be positioned on the pixels (PA1, PA2, and PA3). The display area (DA) may be protected from external air or moisture through the encapsulation layer (ENC). The encapsulation layer (ENC) may be integrally installed to overlap a front side of the display area (DA), and a portion thereof may be disposed in the non-display area (PA).

A first color converter (CC1), a second color converter (CC2), and a transmitter (CC3) may be positioned on the encapsulation layer (ENC). The first color converter (CC1) may overlap the first pixel (PA1), the second color converter (CC2) may overlap the second pixel (PA2), and the transmitter (CC3) may overlap the third pixel (PA3).

Light discharged from the first pixel (PA1) may pass through the first color converter (CC1) to provide red light (LR). Light discharged from the second pixel (PA2) may pass through the second color converter (CC2) to provide green light (LG). Light discharged from the third pixel (PA3) may pass through the transmitter (CC3) to provide blue light (LB).

A stacked structure of the pixels (PA1, PA2, and PA3) and a stacked structure of the first and second color converters (CC1 and CC2) and the transmitter (CC3) will now be described. Referring to FIG. 4, a color converter (CC) may be positioned on the display unit (PP) including the first to third pixels (PA1, PA2, and PA3).

Referring to FIG. 4, a filling layer (FL) is positioned between the display unit (PP) and the color converter (CC). The display unit (PP) and the color converter (CC) are respectively manufactured, they are disposed to face each other, and the filling layer (FL) is filled between the display unit (PP) and the color converter (CC) to be assembled, thereby forming the display panel.

The color converter (CC) includes a first color converter (CC1), a second color converter (CC2), a transmitter (CC3), and a light blocking region (BM) positioned among them. The light blocking region (BM) may be positioned between the first color converter (CC1) and the second color converter (CC2), between the second color converter (CC2) and the transmitter (CC3), and between the transmitter (CC3) and the first color converter (CC1).

A first color filter (CF1), a second color filter (CF2), and a third color filter (CF3) may be positioned on the substrate (SUB) included by the color converter (CC).

The first color filter (CF1) may overlap the first color converter (CC1). The first color filter (CF1) may transmit the red light having passed through a first color converting layer (CCL1) (to be described later) and may absorb light with other wavelengths, and may increase purity of the red light discharged to an outside of the display device.

The second color filter (CF2) may overlap the second color converter (CC2). The second color filter (CF2) may transmit the green light having passed through a second color converting layer (CCL2) (to be described later) and may absorb light with other wavelengths, and may increase purity of the green light discharged to an outside of the display device.

The third color filter (CF3) may overlap the transmitter (CC3). The third color filter (CF3) may transmit the blue light having passed through a transmitting layer (CCL3) (to be described later) and may absorb light with other wavelengths, and may increase purity of the blue light discharged to an outside of the display device.

Regarding the light blocking region (BM), at least some of the first color filter (CF1), the second color filter (CF2), and the third color filter (CF3) may overlap each other. The color converter (CC) may provide a light blocking region for blocking light as a plurality of color filters overlap each other with no additional light blocking member.

A first insulating layer (P1) may be positioned on the first color filter (CF1), the second color filter (CF2), and the third color filter (CF3). The first insulating layer (P1) may include an organic material or an inorganic material. When the first insulating layer (P1) includes an inorganic material, the inorganic material may be a single layer or a multilayer including at least one of a silicon oxide ($SiO_x$), a silicon nitride ($SiN_x$), and a silicon oxynitride ($SiO_xN_y$). When the first insulating layer (P1) is provided as a multilayer according to an embodiment, refractive indices of the respective layers may be different.

A first light blocking member (BM1) may be positioned on the first insulating layer (P1). The first light blocking member (BM1) may define a region in which the first color converting layer (CCL1), the second color converting layer (CCL2), and the transmitting layer (CCL3) are positioned.

The first color converting layer (CCL1), the second color converting layer (CCL2), and the transmitting layer (CCL3) may be positioned in the region defined by the first light blocking member (BM1). The first color converting layer (CCL1), the second color converting layer (CCL2), and the transmitting layer (CCL3) may be formed by an inkjet process, and they may also be formed, without being limited thereto, by using a predetermined manufacturing method.

A metal layer (L1) may be positioned on the first light blocking member (BM1). The metal layer (L1) may cover a lateral side of the first light blocking member (BM1) and one side facing the display unit (PP). The metal layer (L1) may include a metal material, and may, for example, include at least one of aluminum (Al) and silver (Ag). However, this is merely an example, the metal material is not limited thereto, substances with high reflectivity may be used as the material of the metal layer (L1), and the metal layer (L1) may reflect the light that is output to a direction that is not a front side of the display unit (PP) from the first color converting layer (CCL1), the second color converting layer (CCL2), and the transmitting layer (CCL3), and may increase light outputting efficiency. That is, the metal layer (L1) may lead the light so that it may not leak to the lateral side of the display panel but may proceed to the front side of the display unit (PP).

A liquid repellent cover layer (L2) may be positioned on the metal layer (L1). The liquid repellent cover layer (L2) may cover the metal layer (L1). The present specification illustrates an embodiment in which the liquid repellent cover layer (L2) completely covers the metal layer (L1), and without being limited thereto, the liquid repellent cover layer (L2) may be positioned on one side of the metal layer (L1) facing the display unit (PP).

The liquid repellent cover layer (L2) may include a photosensitive material. This may be because the liquid repellent cover layer (L2) is patterned by a photoresist process, which will be described later. In an embodiment, the liquid repellent cover layer (L2) may be made of a black or colored pigment, or may be made inclusive of an acryl-based polymer.

The liquid repellent cover layer (L2) is transparent so it may at least partially transmit the light. The liquid repellent cover layer (L2) may have liquid repellency. When the first color converting layer (CCL1), the second color converting layer (CCL2), and the transmitting layer (CCL3) are formed by the inkjet method to be described, the ink may pass through the first light blocking member (BM1), may permeate into an adjacent space, and may generate defects. When the liquid repellent cover layer (L2) has liquid repellency, a surface shape of the ink may be maintained and the ink may be prevented from permeating into the adjacent space.

The transmitting layer (CCL3) may transmit the light with a first wavelength that is input from the display unit (PP), and may include a plurality of scatterers (SC). The light with a first wavelength may be blue light with a maximally emitted peak wavelength of about 380 nm to about 480 nm, for example, equal to or greater than about 420 nm, equal to or greater than about 430 nm, equal to or greater than about 440 nm, or equal to or greater than about 445 nm, and equal to or less than about 470 nm, equal to or less than about 460 nm, or equal to or less than about 455 nm.

The first color converting layer (CCL1) may convert the light with a first wavelength input from the display unit (PP) into red light, and may include a plurality of scatterers (SC) and a plurality of first quantum dots (SN1). A maximum light-emitting peak wavelength of the red light may be about 600 nm to about 650 nm, for example, about 620 nm to about 650 nm.

The second color converting layer (CCL2) may convert the light with a first wavelength input from the display panel into green light, and may include a plurality of scatterers (SC) and a plurality of second quantum dots (SN2). The maximum light-emitting peak wavelength of the green light may be about 500 nm to about 550 nm, for example, about 510 nm to about 550 nm.

The scatterers (SC) may scatter the light that is input to the first color converting layer (CCL1), the second color converting layer (CCL2), and the transmitting layer (CCL3) and may increase efficiency of light.

The first quantum dots (SN1) and the second quantum dots (SN2) (hereinafter, also referred to as semiconductor nanocrystals) may independently include a group II-VI compound, a group III-V compound, a group IV-VI compound, a group IV element or compound, a group I-III-VI compound, a group II-III-VI compound, a group I-II-IV-VI compound, or combinations thereof. The quantum dots may not include cadmium.

The group II-VI compound may be selected from a binary element compound selected from among CdSe, CdTe, ZnS, ZnSe, ZnTe, ZnO, HgS, HgSe, HgTe, MgSe, MgS, and a mixture thereof; a ternary element compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may further include a group III metal.

The group III-V compound may be selected from a binary element compound selected from among GaN, GaP, GaAs, GaSb, AlN, AlP, AlAs, AlSb, InN, InP, InAs, InSb, and a mixture thereof; a ternary element compound selected from among GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from among GaAlNP, GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal (e.g., InZnP).

The group IV-VI compound may be selected from a binary element compound selected from among SnS, SnSe, SnTe, PbS, PbSe, PbTe, and a mixture thereof; a ternary element compound selected from among SnSeS, SnSeTe, SnSTe, PbSeS, PbSeTe, PbSTe, SnPbS, SnPbSe, SnPbTe, and a mixture thereof; and a quaternary element compound selected from among SnPbSSe, SnPbSeTe, SnPbSTe, and a mixture thereof.

The group IV element or compound may be selected from a singular element material selected from among Si, Ge, and a mixture thereof; and a binary element compound selected from among SiC, SiGe, and a mixture thereof, and is not limited thereto.

Examples of the group I-III-VI compound include CuInSe2, CuInS2, CuInGaSe, and CuInGaS, but are not limited thereto. Examples of the group I-II-IV-VI compound include CuZnSnSe and CuZnSnS, but are not limited thereto. The group IV element or compound may be a single element selected from among Si, Ge, and a mixture thereof, or a binary compound selected from among SiC, SiGe, and a mixture thereof.

The group II-III-VI compound may be selected from among ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but are not limited thereto.

The group I-II-IV-VI compound may be selected from among CuZnSnSe and CuZnSnS, but are not limited thereto.

In an embodiment, the quantum dots may not include cadmium. The quantum dot may include a semiconductor nanocrystal based on the group III-V compound including indium and phosphorus. The group III-V compound may further include zinc. The quantum dot may include a semiconductor nanocrystal based on the group II-VI compound including a chalcogen (e.g., sulfur, selenium, tellurium, or a combination thereof) and zinc.

Regarding the quantum dot, the above-described binary compound, the tertiary compound, and/or the quaternary compound may exist in the particles with uniform concentration, or may exist in the same particles with a concentration distribution partially divided into some states. Further, the color conversion media layer may have a core/shell structure where one quantum dot surrounds another quantum dot. An interface between the core and the shell may have a concentration gradient such that a concentration of an element existing in the shell is gradually reduced nearing the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multilayer. An interface between the core and the shell may have a concentration gradient such that a concentration of an element existing in the shell is gradually reduced nearing the center thereof. Examples of the shell of the quantum dot include a metallic or non-metallic oxide, a semiconductor compound, or a combination thereof.

For example, the metallic or non-metallic oxide may exemplify binary compounds, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or tertiary compounds such as $MgAl_2O_4$, $CoFe_2O_4$, $NiFe_2O_4$, or $CoMn_2O_4$, but the inventive concepts are not limited thereto.

The semiconductor compound may exemplify CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, and the inventive concepts are not limited thereto.

An interface between the core and the shell may have a concentration gradient such that a concentration of an element existing in the shell is gradually reduced nearing the center thereof. The semiconductor nanocrystal may have a structure including one semiconductor nanocrystal core and a multi-layered shell surrounding the semiconductor nanocrystal core. In an embodiment, the multi-layered shell may have two or more layers, for example, two, three, four, five, or more layers. The two adjacent layers of the shell may have a single composition or different compositions. In the multi-layered shell, each layer may have a composition that varies along the radius.

The quantum dot may have a full width at half maximum (FWHM) of a light-emitting wavelength spectrum that is less than about 45 nm, preferably less than about 40 nm, or further preferably less than about 30 nm, and it may improve color purity or color reproducibility within this range. Further, light emitted through the quantum dot is output in all directions, thereby improving a light viewing angle.

Regarding the quantum dot, a shell material and a core material may have different energy bandgaps. For example, the energy bandgap of the shell material may be greater than that of the core material. In another embodiment, the energy bandgap of the shell material may be less than that of the core material. The quantum dot may have a multi-layered shell. Regarding the multi-layered shell, the energy bandgap of an outer layer may be greater than the energy bandgap of an inner layer (i.e., a layer that is near the core). Regarding the multi-layered shell, the energy bandgap of the outer layer may be less than the energy bandgap of the inner layer.

The quantum dot may adjust the absorption/emission wavelength by adjusting the composition and the size thereof. The maximum light-emitting peak wavelength of the quantum dot 131 may have a wavelength range from ultraviolet to infrared or higher.

The quantum dot may include an organic ligand (e.g., having a hydrophobic residue and/or a hydrophilic residue). The organic ligand residue may be combined to the surface of the quantum dot. The organic ligand may include RCOOH, RNH2, R2NH, R3N, RSH, R3PO, R3P, ROH, RCOOR, RPO(OH)2, RHPOOH, R2POOH, or a combination thereof, and here, R may independently be a C3 to C40 substituted or unsubstituted aliphatic hydrocarbon group such as a C3 to C40 (e.g., C5 to C24) substituted or unsubstituted alkyl group, or a substituted or unsubstituted alkenyl group, a C6 to C40 (e.g., C6 to C20) substituted or unsubstituted aromatic hydrocarbon group, such as a C6 to C40 substituted or unsubstituted aryl group, or a combination thereof.

Examples of the organic ligand may include thiol compounds, such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctyl phosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide; diphenyl phosphine, a triphenyl phosphine compound or oxide compounds thereof; C5 to C20 alkyl phosphinic acids such as hexyl phosphinic acid, octyl phosphinic acid, dodecane phosphinic acid, tetradecane phosphinic acid, hexadecane phosphinic acid, or octadecane phosphinic acid; and C5 to C20 alkyl phosphonic acids. The quantum dot may include the organic ligand alone or as a mixture of at least one kind. The hydrophobic organic ligand may not include a photopolymerizable residue (e.g., acrylate or methacrylate).

A second insulating layer (P2) may be positioned on the first color converting layer (CCL1), the second color converting layer (CCL2), and the transmitting layer (CCL3). The second insulating layer (P2) covers the first color converting layer (CCL1), the second color converting layer (CCL2), and the transmitting layer (CCL3) and protects them to prevent foreign particles from being input to the first color converting layer (CCL1), the second color converting layer (CCL2), and the transmitting layer (CCL3). The second insulating layer (P2) may include an organic material or an inorganic material, and the inorganic material may include at least one of the silicon oxide ($SiO_x$), the silicon nitride ($SiN_x$), and the silicon oxynitride ($SiO_xN_y$).

Figure 5:
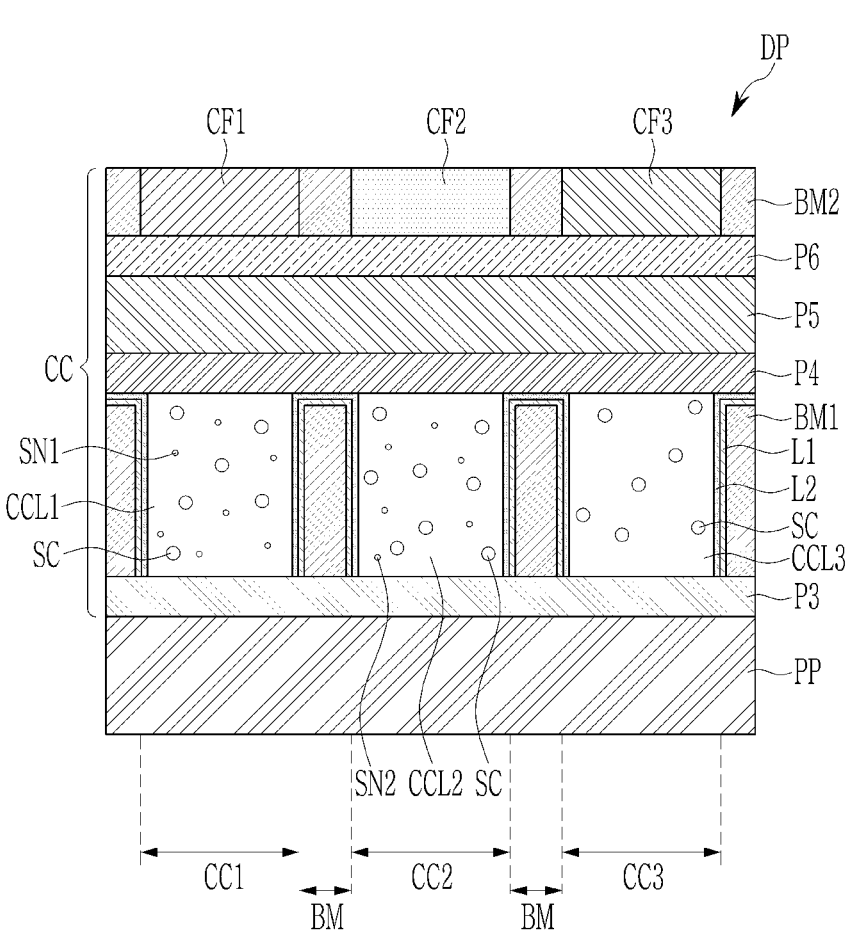
FIG. 5 shows a cross-sectional view of a display panel according to an embodiment.
Figure 6:
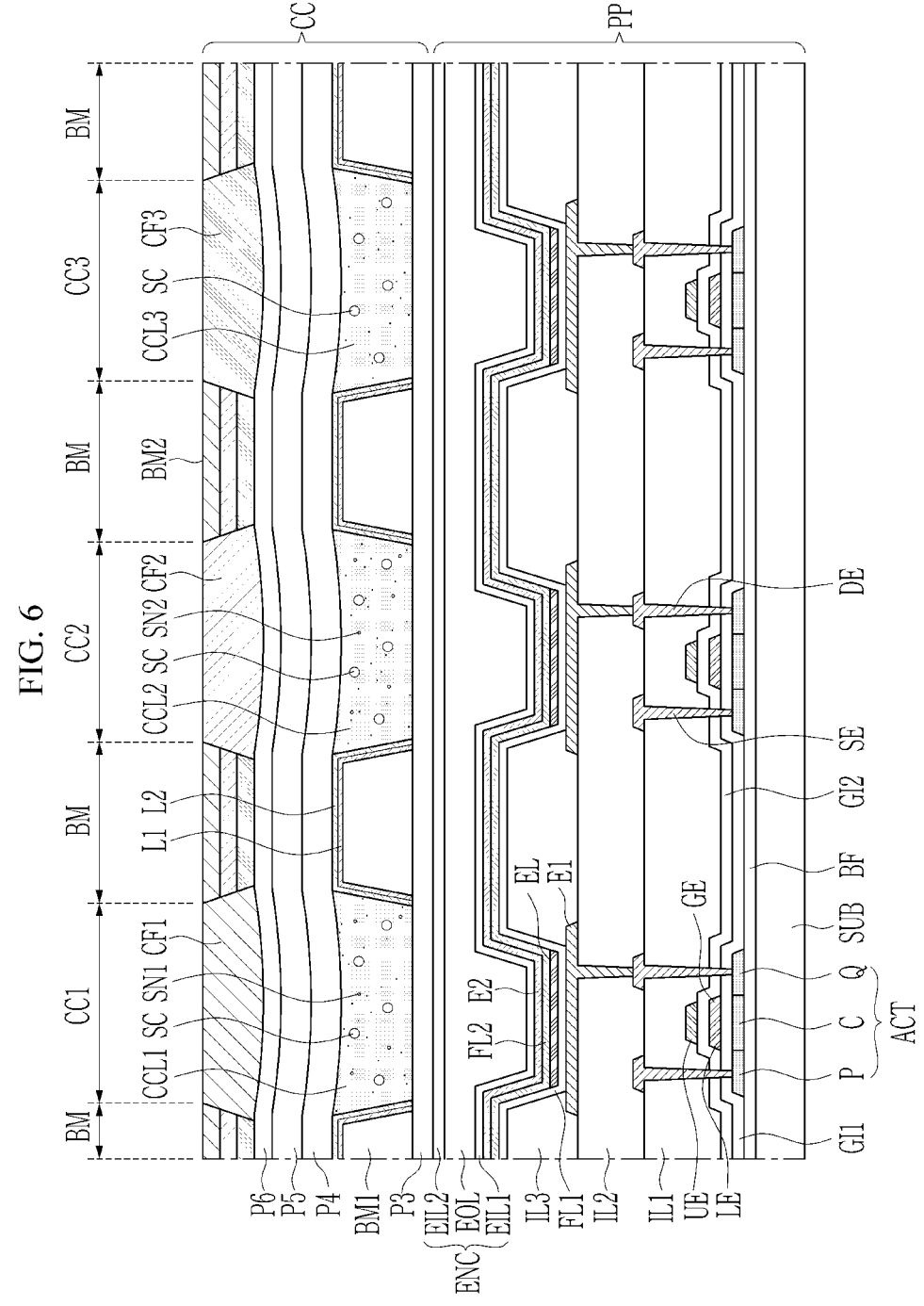
FIG. 6 shows a cross-sectional view of a display panel according to an embodiment.

A display panel according to an embodiment will now be described with reference to FIG. 5 and FIG. 6. FIG. 5 and FIG. 6 show cross-sectional views of a display panel according to an embodiment. Description of the same constituent elements as the above-described content may be omitted.

A third insulating layer (P3) may be positioned on the display unit (PP). The first color converting layer (CCL1), the second color converting layer (CCL2), and the transmitting layer (CCL3) may be positioned on the third insulating layer (P3).

A first light blocking member (BM1) may be positioned on the third insulating layer (P3). The first light blocking member (BM1) may define the region in which the first color converting layer (CCL1), the second color converting layer (CCL2), and the transmitting layer (CCL3) are positioned.

The first color converting layer (CCL1), the second color converting layer (CCL2), and the transmitting layer (CCL3) are positioned in the region defined by the first light blocking member (BM1). The first color converting layer (CCL1), the second color converting layer (CCL2), and the transmitting layer (CCL3) may be formed by the inkjet process, and without being limited thereto, they may be formed by using a predetermined manufacturing method.

A metal layer (L1) may be positioned on the first light blocking member (BM1). The metal layer (L1) may cover the lateral side of the first light blocking member (BM1) and the upper side of the first light blocking member (BM1) facing the color filters (CF1, CF2, and CF3).

The metal layer (L1) may include a metal material, for example, at least one of aluminum (Al) and silver (Ag). However, this is merely an example, the metal material is not limited thereto, substances with high reflectivity may be used as the material of the metal layer (L1), and the metal layer (L1) may reflect the light that is output to a direction that is not a front side of the display unit (PP) from the first color converting layer (CCL1), the second color converting layer (CCL2), and the transmitting layer (CCL3), and may increase light outputting efficiency. That is, the metal layer (L1) may lead the light so that it may not leak to the lateral side of the display panel but may proceed to the front side of the display panel (DP).

A liquid repellent cover layer (L2) may be positioned on the metal layer (L1). The liquid repellent cover layer (L2) may cover the metal layer (L1). In the present embodiment, the liquid repellent cover layer (L2) completely covers the metal layer (L1), and without being limited thereto, the liquid repellent cover layer (L2) may be positioned on one side of the metal layer (L1) facing the color filters (CF1, CF2, and CF3).

The liquid repellent cover layer (L2) may include a photosensitive material. This may be because the liquid repellent cover layer (L2) is patterned by a photoresist process, which will be described in a later portion of the present specification. In an embodiment, the liquid repellent cover layer (L2) may be made of a black or colored pigment, or may be made inclusive of an acryl-based polymer.

The liquid repellent cover layer (L2) is transparent so it may at least partly transmit the light. The liquid repellent cover layer (L2) may have liquid repellency. When the first color converting layer (CCL1), the second color converting layer (CCL2), and the transmitting layer (CCL3) are formed by the inkjet method to be described, the ink may pass through the first light blocking member (BM1), may permeate into an adjacent space, and may generate defects. When the liquid repellent cover layer (L2) has liquid repellency, a surface shape of the ink may be maintained and the ink may be prevented from permeating into the adjacent space.

A fourth insulating layer (P4), a fifth insulating layer (P5), and a sixth insulating layer (P6) may be positioned on the first color converting layer (CCL1), the second color converting layer (CCL2), and the transmitting layer (CCL3).

The respective fourth insulating layer (P4), the fifth insulating layer (P5), and the sixth insulating layer (P6) may independently include an inorganic material or an organic material. The inorganic material may be a single layer or a multilayer including at least one of the silicon oxide ($SiO_x$), the silicon nitride ($SiN_x$), and the silicon oxynitride ($SiO_xN_y$). According to an embodiment, at least one of the fourth insulating layer (P4), the fifth insulating layer (P5), and the sixth insulating layer (P6) may be omitted.

A first color filter (CF1), a second color filter (CF2), and a third color filter (CF3) may be positioned on an upper side of the sixth insulating layer (P6).

The second light blocking member (BM2) may be made by overlapping at least two of the first color filter (CF1), the second color filter (CF2), and the third color filter (CF3). The color converter (CC) may provide a light blocking region without an additional light blocking member as a plurality of color filters overlap each other.

The metal layer (L1) and the liquid repellent cover layer (L2) may overlap the first light blocking member (BM1) and the second light blocking member (BM2). The metal layer (L1) and the liquid repellent cover layer (L2) may overlap at least two of the first color filter (CF1), the second color filter (CF2), and the third color filter (CF3).

The display unit (PP) will now be described with reference to FIG. 6.

The display unit (PP) includes a substrate (SUB). The substrate (SUB) may include an inorganic insulating material such as glass or an organic insulating material such as plastic that is like a polyimide (PI). The substrate (SUB) may be a single layer or a multilayer. The substrate (SUB) may have a structure in which at least one base layer including sequentially stacked polymer resins and at least one inorganic layer are alternately stacked.

The substrate (SUB) may have various degrees of flexibility. The substrate (SUB) may be a rigid substrate or a bending, folding, and rolling flexible substrate.

A buffer layer (BF) may be positioned on the substrate (SUB). The buffer layer (BF) may prevent characteristic degradation of the semiconductor layer (ACT) and stresses by preventing impurities from being transmitted to the upper layer of the buffer layer (BF), particularly the semiconductor layer (ACT) from the substrate (SUB). The buffer layer (BF) may include an inorganic insulating material or organic insulating material, such as a silicon nitride or a silicon oxide. Some or all of the buffer layer (BF) may be omitted.

A semiconductor layer (ACT) is positioned on the buffer layer (BF). The semiconductor layer (ACT) may include at least one of polysilicon and an oxide semiconductor. The semiconductor layer (ACT) includes a channel region (C), a first region (P), and a second region (Q). The first region (P) and the second region (Q) are disposed on respective sides of the channel region (C). The channel region (C) includes a semiconductor to which a small amount of impurities are/are not doped, and the first region (P) and the second region (Q) may include a semiconductor to which a large amount of impurities are doped compared to the channel region (C). The semiconductor layer (ACT) may be made of an oxide semiconductor, and in this case, a protection layer (not shown) for protecting an oxide semiconductor material that is susceptible to external conditions, such as a high temperatures, may be added thereto.

A first gate insulating layer (GI1) is positioned on the semiconductor layer (ACT).

A gate electrode (GE) and a lower electrode (LE) are positioned on the first gate insulating layer (GI1). According to an embodiment, the gate electrode (GE) and the lower electrode (LE) may be integrally formed.

The gate electrode (GE) and the lower electrode (LE) may be a single layer or a multilayer on which a metal film including one of copper (Cu), a copper alloy, aluminum (Al), an aluminum alloy, molybdenum (Mo), a molybdenum alloy, titanium (Ti), and a titanium alloy is stacked. The gate electrode (GE) may overlap the channel region (C) of the semiconductor layer (ACT).

A second gate insulating layer (GI2) may be positioned on the gate electrode (GE) and the first gate insulating layer (GI1). The first gate insulating layer (GI1) and the second gate insulating layer (GI2) may be a single layer or a multilayer including at least one of the silicon oxide ($SiO_x$), the silicon nitride ($SiN_x$), and the silicon oxynitride ($SiO_xN_y$).

An upper electrode (UE) may be positioned on the second gate insulating layer (GI2). The upper electrode (UE) may overlap the lower electrode (LE) and may form a storage capacitor.

A first inter-layer insulating layer (IL1) may be positioned on the upper electrode (UE). The first inter-layer insulating layer (IL1) may be a single layer or a multilayer including at least one of the silicon oxide ($SiO_x$), the silicon nitride ($SiN_x$), and the silicon oxynitride ($SiO_xN_y$).

A source electrode (SE) and a drain electrode (DE) are positioned on the first inter-layer insulating layer (IL1). The source electrode (SE) and the drain electrode (DE) are connected to a first region (P) and a second region (Q) of the semiconductor layer (ACT) through contact holes formed in the insulating layers.

The source electrode (SE) and the drain electrode (DE) may include aluminum (Al), silver (Ag), magnesium (Mg), gold (Au), chromium (Cr), nickel (Ni), calcium (Ca), molybdenum (Mo), titanium (Ti), tungsten (W), and/or copper (Cu), and may have a single layer or a multilayer including the same.

A second inter-layer insulating layer (IL2) is positioned on the first inter-layer insulating layer (IL1), the source electrode (SE), and the drain electrode (DE). The second inter-layer insulating layer (IL2) may include an organic insulating material such as a general-purpose polymer such as poly(methyl methacrylate) (PMMA) or polystyrene (PS), a polymer derivative having a phenol-based group, an acryl-based polymer, an imide-based polymer, a polyimide, an acryl-based polymer, and a siloxane-based polymer.

A first electrode (E1) may be positioned on the second inter-layer insulating layer (IL2). The first electrode (E1) may be connected to the drain electrode (DE) through a contact hole of the second inter-layer insulating layer (IL2).

The first electrode (E1) may include a metal such as silver (Ag), lithium (Li), calcium (Ca), aluminum (Al), magnesium (Mg), or gold (Au), and may include a transparent conductive oxide (TCO) such as an indium tin oxide (ITO) or an indium zinc oxide (IZO). The first electrode (E1) may be made with a single layer including a metal material or a transparent conductive oxide or a multilayer including the same. For example, the first electrode (E1) may have a triple-layered structure of indium tin oxide (ITO)/silver (Ag)/indium tin oxide (ITO).

The transistor configured with a gate electrode (GE), a semiconductor layer (ACT), a source electrode (SE), and a drain electrode (DE) may be connected to the first electrode (E1) and may supply a current to the light-emitting device.

A pixel defining layer (IL3) is positioned on the second inter-layer insulating layer (IL2) and the first electrode (E1). Although not shown, a spacer (not shown) may be positioned on the pixel defining layer (IL3). The pixel defining layer (IL3) includes a pixel defining layer opening overlapping at least part of the first electrode (E1) and defining a light emitting region.

The pixel defining layer (IL3) may include an organic insulating material such as a general-purpose polymer such as poly(methyl methacrylate) (PMMA) or polystyrene (PS), a polymer derivative having a phenol-based group, an acryl-based polymer, an imide-based polymer, a polyimide, an acryl-based polymer, and a siloxane-based polymer.

The pixel defining layer (IL3) may overlap the first light blocking member (BM1) and the second light blocking member (BM2). The pixel defining layer (IL3) may thus also overlap the light blocking region (BM).

An emission layer (EL) is positioned on the first electrode (E1). Function layers (FL1 and FL2) may be positioned on an upper portion and a lower portion of the emission layer (EL). The first function layer (FL1) may be a multilayer including at least one of a hole injection layer (HIL) and a hole transporting layer (HTL), and the second function layer FL2 may be a multilayer including at least one of an electron transporting layer (ETL) and an electron injection layer (EIL). The function layers (FL1 and FL2) may overlap the front side of the substrate (SUB).

A second electrode (E2) may be positioned on the function layers (FL1 and FL2). The second electrode (E2) may include a reflective metal including calcium (Ca), barium (Ba), magnesium (Mg), aluminum (Al), silver (Ag), gold (Au), nickel (Ni), chromium (Cr), lithium (Li), and calcium (Ca) or a transparent conductive oxide (TCO) including an indium tin oxide (ITO) and an indium zinc oxide (IZO).

The first electrode (E1), the emission layer (EL), the function layers (FL1 and FL2), and the second electrode (E2) may configure a light-emitting device. The first electrode (E1) may be an anode that is a hole injecting electrode, and the second electrode (E2) may be a cathode that is an electron injecting electrode. The embodiment is not limited thereto, and the first electrode (E1) may be a cathode and the second electrode (E2) may be an anode according to a method for driving an emissive display device.

When holes and electrons are injected into the emission layer (EL) from the first electrode (E1) and the second electrode (E2), and excitons that are a combination of the injected holes and electrons fall to the ground state from the excited state, light emits.

An encapsulation layer (ENC) is positioned on the second electrode (E2). The encapsulation layer (ENC) may cover the upper side of the light-emitting device and the lateral side to seal them. Because the light-emitting device is very susceptible to moisture and oxygen, the encapsulation layer (ENC) seals the light-emitting device to prevent an inflow of moisture and oxygen.

The encapsulation layer (ENC) may include a plurality of layers, and may be formed of a multilayer including an inorganic layer and an organic layer. For example, the encapsulation layer (ENC) may be formed to be a triple layer of the sequentially stacked first encapsulating inorganic layer (EIL1), the encapsulating organic layer (EOL), and the second encapsulating inorganic layer (EIL2).

The first encapsulating inorganic layer (EIL1) may cover the second electrode (E2). The first encapsulating inorganic layer (EIL1) may prevent external moisture or oxygen from permeating into the light-emitting device. For example, the first encapsulating inorganic layer (EIL1) may include a silicon nitride, a silicon oxide, a silicon oxynitride, or a combined compound thereof. The first encapsulating inorganic layer (EIL1) may be formed by a deposition process.

The encapsulating organic layer (EOL) may be disposed on the first encapsulating inorganic layer (EIL1) and may contact the first encapsulating inorganic layer (EIL1). Curves formed on the upper side of the first encapsulating inorganic layer (EIL1) or particles provided on the first encapsulating inorganic layer (EIL1) are covered by the encapsulating organic layer (EOL), so a surface state of the upper side of the first encapsulating inorganic layer (EIL1) may intercept influences applied to the configurations formed on the encapsulating organic layer (EOL). The encapsulating organic layer (EOL) may ease the stress among the contacted layers. The encapsulating organic layer (EOL) may include an organic material, and may be formed through a solution process such as spin coating, slit coating, or an inkjet process.

The second encapsulating inorganic layer (EIL2) is disposed on the encapsulating organic layer (EOL) to cover the encapsulating organic layer (EOL). The second encapsulating inorganic layer (EIL2) may be stably formed on a relatively planar side than is disposed on the first encapsulating inorganic layer (EIL1). The second encapsulating inorganic layer (EIL2) encapsulates the moisture discharged from the encapsulating organic layer (EOL) to prevent its inflow to the outside. The second encapsulating inorganic layer (EIL2) may include a silicon nitride, a silicon oxide, a silicon oxynitride, or a combined compound thereof. The second encapsulating inorganic layer (EIL2) may be formed through a deposition process.

Although not included in the description of the present embodiment, a capping layer positioned between the second electrode (E2) and the encapsulation layer (ENC) may be further included. The capping layer may include an organic material. The capping layer protects the second electrode (E2) from a subsequent process, for example, a sputtering process, and improves light outputting efficiency of the light-emitting device. The capping layer may have a greater refractive index than the first encapsulating inorganic layer (EIL1).

A method for manufacturing a display device according to an embodiment will now be described with reference to FIG. 7 to FIG. 13. FIG. 7, FIG. 8, FIG. 9, FIG. 10, FIG. 11, FIG. 12, and FIG. 13 show cross-sectional views of a method for manufacturing a display device. The same constituent elements as the above-described content will be omitted.

Figure 7:
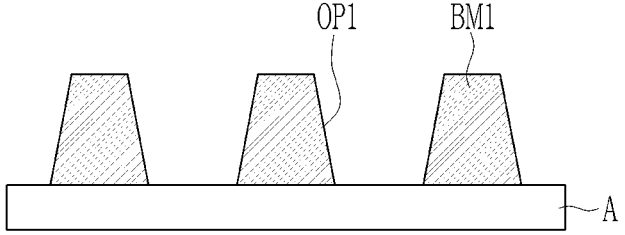
FIG. 7, FIG. 8, FIG. 9, FIG. 10, FIG. 11, FIG. 12, and FIG. 13 show cross-sectional views of a method for manufacturing a display device.

Referring to FIG. 7, a first light blocking member (BM1) is formed on the first insulating layer (P1) according to an embodiment described with reference to FIG. 4 or a layer (A) that corresponds to the third insulating layer (P3) according to an embodiment described with reference to FIG. 5. The first light blocking member (BM1) may include a first opening (OP1). The first opening (OP1) included by the first light blocking member (BM1) may define the region in which the first color converting layer (CCL1), the second color converting layer (CCL2), and the transmitting layer (CCL3) are positioned.

Figure 8:
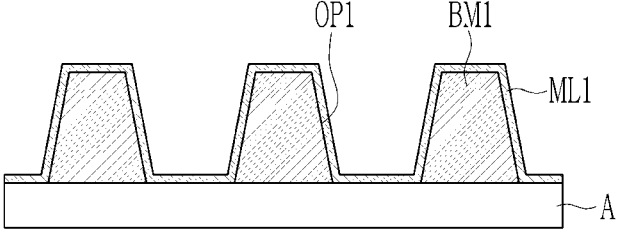
Figure 9:
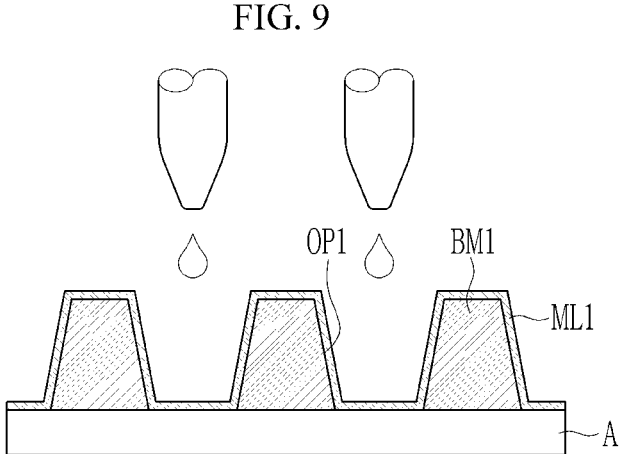
Figure 10:
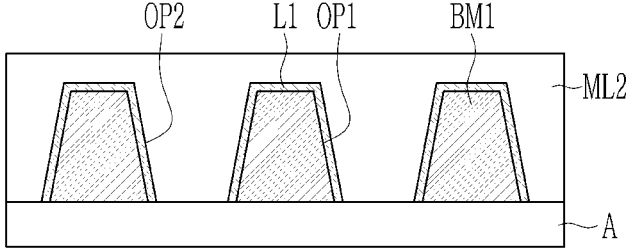

Referring to FIG. 8, a metal thin film (ML1) may be deposited on the front side of the first light blocking member (BM1). The metal thin film (ML1) may include a metal material, for example, at least one of aluminum (Al) and silver (Ag). This is merely an example, and the metal material is not limited thereto, and substances with high reflectivity may be used as the material of the metal thin film (ML1), and as shown in FIG. 9, an inkjet etching process is performed on the region overlapping the first opening (OP1). An etchant for etching the metal thin film (ML1) is dripped in the first opening (OP1). Hence, as shown in FIG. 10, a metal layer (L1) including a second opening (OP2) may be formed.

Figure 11:
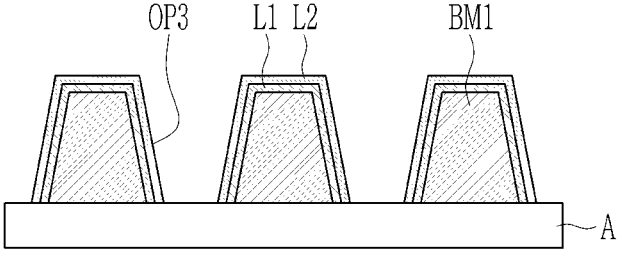
Figure 12:
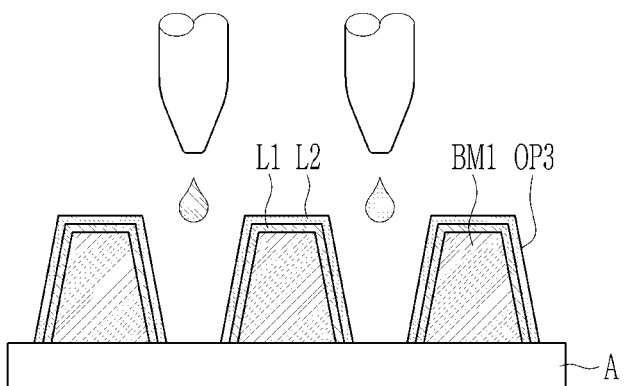
Figure 13:
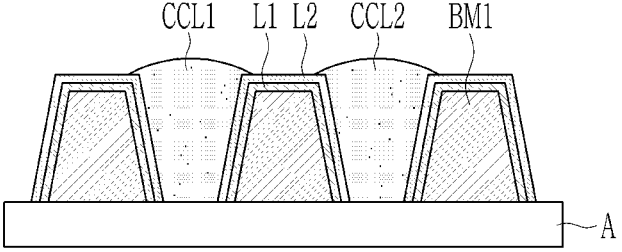

A liquid repellent material layer (ML2) is applied on the first light blocking member (BM1) and the metal layer (L1). When the liquid repellent material layer (ML2) is applied and cured, the liquid repellent cover layer (L2) including a third opening (OP3) may be formed through a patterning process as shown in FIG. 11.

A first color converting layer (CCL1) and a second color converting layer (CCL2) may be respectively formed in the first opening (OP1) and the second opening (OP2) overlapping each other according to the inkjet process.

The metal layer (L1) is formed by dripping the etchant in the opening of the first light blocking member (BM1), which generates excellent etching efficiency and may be advantageous in manufacturing the high-resolution display panel. No additional mask is needed, which may simplify the manufacturing process and may be advantageous in manufacturing the wide display device.

The liquid repellent cover layer (L2) surrounding the metal layer (L1) provides liquid repellency to the first light blocking member (BM1), so the color converting layers (CCL1 and CCL2) and the transmitting layer (CCL3) provided by the inkjet process may be stably formed in the opening.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

<Description of symbols>

| | |
|---|---|
| PP: display unit | CC: color converter |
| CC1: first color converter | CC2: second color converter |
| CC3: transmitter | BM: light blocking region |
| CCL1: first color converting layer | CCL2: second color converting layer |
| CCL3: transmitting layer | BMI: first light blocking member |
| CF1, CF2, CF3: color filter | L1: metal layer |
| L2: liquid repellent cover layer | BM2: second light blocking member |

What is claimed is:

1. A display device comprising:
a display unit including a plurality of pixels; and
a color converter overlapping the display unit,
wherein:
the color converter includes a first color converter, a second color converter, a transmitter, and a light blocking member,
the first color converter includes:
a first color converting layer including first semiconductor nanocrystals; and
a first color filter overlapping the first color converting layer;
the second color converter includes:
a second color converting layer including second semiconductor nanocrystal; and
a second color filter overlapping the second color converting layer;
the transmitter includes a transmitting layer;
the light blocking member includes:

a light blocking member disposed among the adjacent first color converting layer, the second color converting layer, and the transmitting layer;
a metal layer disposed on the light blocking member; and
a liquid repellent cover layer overlapping the metal layer, configured to prevent ink migration; and the liquid repellent cover layer comprises a photosensitive polymer layer; wherein the liquid repellent cover layer is transparent so that it at least partially transmits light; wherein:
the transmitter further includes a third color filter overlapping the transmitting layer; and
at least two of the first color filter, the second color filter, and the third color filter overlap each other on the light blocking member.

2. The display device of claim 1, wherein the metal layer covers a lateral side and a side of the light blocking member.

3. The display device of claim 1, wherein the metal layer includes at least one of aluminum (Al) and silver (Ag).

4. The display device of claim 2, wherein the liquid repellent cover layer overlaps a side of the light blocking member.

5. The display device of claim 4, wherein the liquid repellent cover layer overlaps the lateral side of the light blocking member.

6. The display device of claim 1, wherein the metal layer and the liquid repellent cover layer overlap at least two of the first color filter, the second color filter, and the third color filter overlapping the light blocking member.

7. The display device of claim 1, wherein the display unit includes:
a first substrate;
a transistor disposed on the first substrate;
a first electrode electrically connected to the transistor;
a pixel defining layer overlapping at least a portion of the first electrode;
an emission layer disposed on the first electrode; and
a second electrode disposed on the emission layer.

8. The display device of claim 7, wherein the pixel defining layer overlaps the light blocking member.

* * * * *